United States Patent
Gajanana et al.

(10) Patent No.: US 8,064,177 B2
(45) Date of Patent: Nov. 22, 2011

(54) ESD PROTECTION FOR DC/DC CONVERTER

(75) Inventors: Deepak Gajanana, Diemen (NL);
Yorgos Christoforou, Arnhem (NL);
Hermanus J. Effing, Overasselt (NL)

(73) Assignee: ST-Ericsson SA, Geneva (CH)

( * ) Notice: Subject to any disclaimer, the term of this patent is extended or adjusted under 35 U.S.C. 154(b) by 0 days.

(21) Appl. No.: 12/310,580

(22) PCT Filed: Aug. 28, 2007

(86) PCT No.: PCT/IB2007/053456
§ 371 (c)(1),
(2), (4) Date: Aug. 2, 2010

(87) PCT Pub. No.: WO2008/026163
PCT Pub. Date: Mar. 6, 2008

(65) Prior Publication Data
US 2010/0296209 A1    Nov. 25, 2010

(51) Int. Cl.
*H02H 9/00* (2006.01)
*H01C 7/12* (2006.01)
*H02H 1/00* (2006.01)
*H02H 1/04* (2006.01)

(52) U.S. Cl. .......................................... 361/56; 361/118
(58) Field of Classification Search ................... 361/56, 361/118
See application file for complete search history.

(56) References Cited

U.S. PATENT DOCUMENTS

| | | | |
|---|---|---|---|
| 6,011,681 A * | 1/2000 | Ker et al. | ...... 361/111 |
| 6,775,112 B1 | 8/2004 | Smith et al. | |
| 2002/0027756 A1 | 3/2002 | Lopez et al. | |
| 2002/0105307 A1 | 8/2002 | Groeneveld et al. | |

FOREIGN PATENT DOCUMENTS

JP  07 288456 A  10/1995

OTHER PUBLICATIONS

International Search Report dated Feb. 25, 2008 in connection with PCT Patent Application No. PCT/IB2007/053456.

* cited by examiner

*Primary Examiner* — Dharti Patel

(57) ABSTRACT

The present invention relates to an electronic device including electronic circuitry, wherein the circuitry includes a first switching transistor (MN1) being adapted to serve as an integrated switch, and a first clamp transistor (MNC1) being coupled to the first switching transistor and being adapted to protect the first switching transistor (MN1) if an ESD event occurs.

10 Claims, 9 Drawing Sheets

ESD PROTECTION FOR DC/DC CONVERTER

CROSS-REFERENCE TO RELATED APPLICATION(S)

The present application claims priority under 35 U.S.C. §365 to International Patent Application No. PCT/IB2007/053456 filed Aug. 28, 2007, entitled "ESD PROTECTION". International Patent Application No. PCT/IB2007/053456 claims priority under 35 U.S.C. §365 and/or 35 U.S.C. §119 (a) to European Patent Application No. 06119799.2 filed Aug. 30, 2006 and which are incorporated herein by reference into the present disclosure as if fully set forth herein.

FIELD OF THE INVENTION

The present invention relates to an electronic circuitry with electrostatic discharge protection implementation for integrated switches, more specifically an electronic device for DC/DC converter switches.

BACKGROUND OF THE INVENTION

Today's electronic devices, as e.g. PDAs, smart phones, web pads or any other kinds of handheld products usually have complete, highly integrated power management units (PMU). These power management units often include a plurality of integrated DC/DC converters. Integrated DC/DC converters are necessary for power efficient supply voltage generation. The battery or power management is real-time software-controlled in order to adapt the system dynamically to different operating conditions.

One of the most often used concepts for DC/DC conversion is the inductive down or up or auto DC/DC converter. In one typical configuration the inductive converter is implemented by four switches, two for the up converting part and two for the down converting part, an inductor and some additional circuitries. The switches are usually implemented by P-type metal oxide silicon field effect transistors (PMOSFET) and N-type metal oxide silicon field effect transistors (NMOSFET) which are integrated on a semiconductor substrate. The integrated circuitry including the MOS transistors is coupled to battery cells (e.g. NiCd/NiMH or Li-Ion/Li-polymer battery pack) and to an inductor via respective pads of the integrated circuitry. Additionally, the integrated DC/DC conversion unit can also comprise a controller circuitry being typically analog or digital. As for all kinds of integrated circuits, the integrated semiconductor devices need protection against excess currents and excess voltages caused by electrostatic discharge (ESD) or electrostatic overstress (EOS). Since the switching NMOS and PMOS transistors of the integrated DC/DC conversion units are to be directly coupled to the external electronic components, known solutions aim to provide direct protection for the transistors.

Accordingly, existing techniques resort for example to adapting the integral properties of the integrated transistors in order to meet ESD requirements. A special manufacturing technique known for example from U.S. Pat. No. 6,858,900 as "un-silicidation" (removal of self-aligned silicide) is used. This technique consists in blocking the deposition of layers of metals like tungsten, titanium or cobalt that are usually used to reduce the access resistance to the drain or source side of a MOS transistor. This measure requires an additional fabrication mask. Additionally, the gate to drain (or source) distance has to be increased, and by doing this a ballast resistor is added due to the higher access resistance of the drain or source diffusions. This leads to smooth flow of ESD current through the drain or source diffusions. However, the main disadvantage of the mentioned technique is that the area consumed by such a protected transistor is considerably increased.

Other known solutions, as for example described in WO 03/094241, provide special layout techniques for adding ballast distributed resistors between the source and the gate as well as the drain and the gate of the integrated MOS devices. In this case the silicide is not removed and the transistor occupies less area. However, this solution requires a special layout technique that is very sensitive to process variations and namely the silicide resistance. The silicide resistance as a process parameter has usually large dispersion in most commercial CMOS processes. And finally, the known solutions can hardly be modeled or simulated, because they are based on the assumption that the transistor will operate in a parasitic bipolar operation regime (snap-back) which is typically not modeled. This renders the behavior of the electronic device very difficult to model. Due to their process dependency, these concepts are also very difficultly portable between different manufacturing processes, but also between fabrication sites.

SUMMARY OF THE INVENTION

It is an object of the present invention to provide an electronic circuit with a small and efficient integrated ESD protection circuitry for an integrated switching transistor. It is another object of the present invention to provide an ESD protection circuit for DC/DC conversion. It is also an object of the present invention to provide versatile ESD protection circuitry being easy to simulate and portable between different technologies and fabrication sites. The invention is defined by the independent claim. Dependent claims describe advantageous embodiments.

According to a first aspect of the present invention an electronic device is presented that includes a first switching transistor being adapted to serve as an integrated switch, and a first clamp transistor being coupled to the first switching transistor and being adapted to protect the first switching transistor if an ESD event occurs. According to this aspect of the invention, the ESD protection is implemented by a first clamp transistor that is used to support the first transistor against over current or over voltage. The second transistor is arranged to be activated, e.g. switched on, if an ESD event occurs that may destroy the first transistor alone. For this purpose, the second transistor may for example be coupled in parallel to the first transistor. However, as typical for up and down converters other switching transistors may be coupled between the two transistors as long as the over current of the ESD event can be discharged via the clamp transistor thereby reducing the over voltage at the first transistor. The ESD protection according to this aspect of the invention is particularly useful for DC/DC conversion. The protection concept according to the first aspect of the invention can be applied to the switches of DC/DC converters, for example to the up converting part, the down converting part or both parts of an DC/DC converter. The switches are usually integrated on semiconductor devices, and they have to be coupled to external components. Accordingly, efficient ESD protection for the switching transistors is mandatory. Further, this aspect of the present invention is particularly advantageous for circuitry that is used for DC/DC conversion, due to the fact that the switching transistors have to provide low ohmic channels (to have small power losses and high efficiency). The requirements for the protective clamp transistors are inherently reduced for switching transistors with small electrical resistance. Conventionally, only a single switching transistor was present to handle all the ESD current. This transistor was implemented by special layout techniques in order to be suitable for over currents. According to the present invention, a further clamp transistor is included and coupled to the switching transistor. Accordingly, the width of the switching transistor can be reduced and special layout techniques are dispensable. The combined width of the switching and the clamp transistor designed by conventional layout techniques, is still less than ESD protection according to the prior art using special layout techniques for e.g. NMOS devices as described above with respect to the known techniques. Accordingly, a rail based ESD protection for integrated converter switches is provided.

According to another aspect of the invention, the switching transistor and the clamp transistors are adapted to be simultaneously switched on, if an ESD event occurs, that would otherwise destroy the first transistor without protection. Accordingly, the devices are arranged and controlled to cooperate and the requirements for both, the switching and the clamp transistor are further reduced.

According to an aspect of the invention a second switching transistor is adapted to serve as an integrated switch, and a second clamp transistor is coupled to the second switching transistor. The second clamp transistor is also adapted to protect the second switching transistor as described above, if an ESD event occurs. Two switching transistors being both protected by two clamp transistors in accordance with the first aspect of the present invention can be used for DC/DC converters providing up and down conversion by the same electronic device. The switching transistors and the respective clamp transistors may be arranged in the up converting part and the down converting part. Accordingly, the electronic device is protected against ESD events occurring on each part of the device.

According to still another aspect of the invention there is a third switching transistor being coupled to the first switching transistor. The first switching transistor is protected as set out above and the two switching transistors are adapted to operate as switches for DC/DC down conversion. Accordingly, an input pin is provided for an input voltage to be converted. According to this configuration, the two switching transistors of a DC/DC down converter are implemented in an electronic device, which is efficiently protected against ESD events. Further, a fourth switching transistor can be coupled to the second switching transistor in order to operate as switches for DC/DC up conversion and to provide an output voltage on an output pin. Additionally, the first clamp transistors and the second clamp transistor are adapted to protect the circuitry, i.e. all the transistors, if an ESD event occurs between the input pin and the output pin. This aspect of the invention relates to a situation, where the switching transistors are arranged to constitute the up- and down conversion parts of an auto DC/DC converter. If the integrated circuitry including the four switching transistors for the auto DC/DC converter is exposed to an ESD event on the input and output pins, not only the first and second switching transistors but also the third and fourth switching transistors may be destroyed. However, if the clamp transistors, which are provided to protect the first and second switching transistors, are activated in case of an ESD event as described above, the excess voltage or current can be discharged via the clamp transistors in order to protect the four switching transistors.

According to another aspect of the invention the clamp transistor is activated by an activating signal. The activating signal can be derived from a current or voltage, which is provided by a device or a path like that does not contribute primarily to the functionality of the circuit. According to one aspect of the invention this can be a parasitic device, like a parasitic capacitance or a parasitic resistor. Further, this can be any device or component, which is inherently present in other devices, such as a back gate diode of a transistor, in particular a MOS transistor. According to this understanding, this aspect of the present invention can be understood as providing an activating signal by means of parasitic current or voltage, or both. The present invention provides also a new concept of how to activate protective circuitry. In addition to sensing directly the over voltage or over current at a pin or close to a pin of an electronic device, it is suggested to sense e.g. only a parasitic current or parasitic voltage that is a result of the ESD event. As the parasitic voltage or current is typically much smaller than the ESD event itself, the requirements for the sensing circuitry are reduced. Further, it is possible to detect an ESD event in a greater distance from the location where the ESD event occurs. This allows to place the sensing and detecting circuitry somewhere on an semiconductor die, where the sensing and detecting devices are not jeopardized by the ESD event. Even other design constraints for the integrated circuit may be reduced.

According to another aspect of the invention, a third switching transistor is present and coupled to the first switching transistor. The third switching transistor is adapted to serve as a second switch for the DC/DC converter. The third switching transistor includes inherently a back gate diode in the electrical path, which is exposed to an ESD event. In this situation the parasitic diode provides a parasitic current from which the activating signal can be derived. "Parasitic" in this context is to be understood as set out above. This aspect of the invention relates e.g. to the back-gate diodes of PMOS transistors. As these diodes provide a forward path around the transistors, they are especially useful for providing a current which is an image of the ESD event.

According to still another aspect of the invention, the electronic device includes also control circuitry for providing the activating signal. The control circuitry provides an activating signal to activate the clamp transistor or both, the clamp transistor and the switching transistor to be protected. Additionally, the control circuitry is adapted to be at least partially supplied by the voltage or current of the ESD event. For this purpose, the control circuit is coupled to an electrical path of the electronic device on which the ESD event is supposed to propagate. If an ESD event occurs, the control circuit is supplied with sufficient current and voltage to activate the clamp transistor in order to protect one or all switching transistors. The control circuit may also activate multiple clamp transistors and switching transistors to provide an electrical path with low resistance in order to discharge the excess current immediately. The control circuit is to be designed to have an appropriate reduced power consumption. This enables the control circuit to operate even if no supply voltage is coupled to the electronic device, i.e. even during manufacturing or assembly of the device. During normal operation the control circuit can be coupled to the input and output pins of the electronic device, if, for example, the switches form part of a DC/DC converter. Accordingly, the control circuit will be supplied by a stable and constant supply voltage. Still further, if the control circuit consumes only little power, the control circuit may be supplied even via the parasitic devices as described above for the activating signal. The term parasitic includes devices which are inherently present in other devices, as the back gate diode of MOS transistors.

The control circuitry can be adapted to provide a switching signal to one or more of the switching transistors and a deactivating signal to one or more clamp transistor during normal operation. Further the control circuitry is adapted to suppress the switching signal and to provide the activating signal to the clamp transistors or to all transistors, if an ESD event occurs. Accordingly, the control circuit allows a normal switching operation as long as no ESD event is detected. If an ESD event occurs, the switching mode is turned off and the clamp transistors are activated. If necessary not only the clamp transistor but all transistors are turned on in order to provide a sufficiently low ohmic path for discharging the point of origin of the ESD event, such that all the transistors are not damaged.

BRIEF DESCRIPTION OF THE DRAWINGS

These and other aspects of the invention will be apparent from and will be elucidated with reference to the embodiments described hereinafter and with respect to the following Figures.

DETAILED DESCRIPTION OF THE EMBODIMENTS

Figure 1:
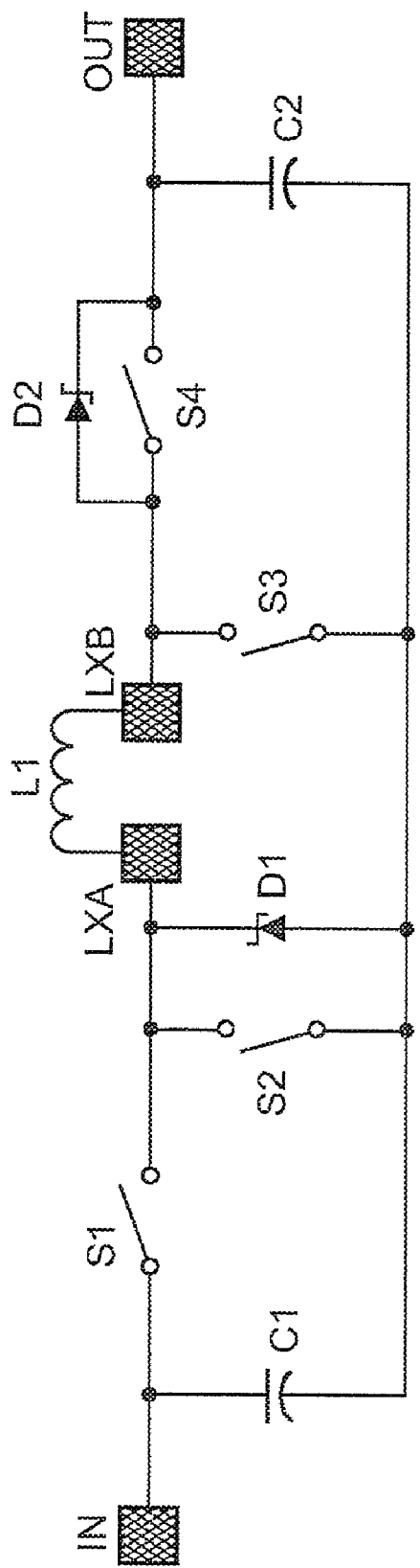
FIG. 1 shows a simplified schematic of an embodiment of a conventional inductive DC/DC converter.

FIG. 1 shows a simplified schematic of a conventional inductive DC/DC converter. Generally, a DC/DC converter, as the one shown in FIG. 1, produces a higher or lower DC output voltage on pin OUT from a constant voltage source like a battery or the like, being coupled to the input pin IN. There are numerous different concepts for DC/DC conversion one of which is the inductive DC/DC converter shown in FIG. 1. The converter shown in FIG. 1 is an inductive up/down-converter which is a combination of an inductive up-converter (right hand side) and an inductive down-converter (left hand side). The inductor L1 is usually implemented externally to an integrated circuit, which includes the switches S1 to S4. Accordingly, L1 is coupled between the pins LXA and LXB. The switches S1 to S4 in combination with the capacitors C1, C2 and the diodes D1, D2 provide a predetermined output voltage at output pin OUT. The output voltage at OUT can be varied in a wide range from values smaller than the input voltage to values greater than the input voltage at pin IN. The different output voltages are adjusted by the switching sequences of S1 to S4, which is produced by digital or analog circuitry. The parts to be integrated on a semiconductor substrate as an integrated circuit are the switches S1 to S4 being for example MOS transistors. However, other technologies are also conceivable for the transistors. In the up-mode, the typical switching sequence is as follows: The cycle starts with a first phase, where S1 and S3 are closed (conducting). In a second phase, S3 opens (not conducting) and S4 starts conducting. In down-mode, the cycle starts with a first phase where S4 and Si are conducting. In the second phase, S1 opens and S2 closes. The control signals are either pulse width modulated (PWM) or pulse frequency modulated (PFM). For PFM, the sequence varies slightly, but the basic functionality is the same. In PWM mode, the switching frequency is fixed. The switches S1 and S4 are typically PMOS transistors. PMOS is suitable to pass a clean VDD or HIGH potential, i.e. without any threshold voltage drops across the transistor. As NMOS can pass a clean GND potential, S2 and S3 are implemented by NMOS transistors. The conversion principle will not further be addressed in more detail in this description.

Figure 2:
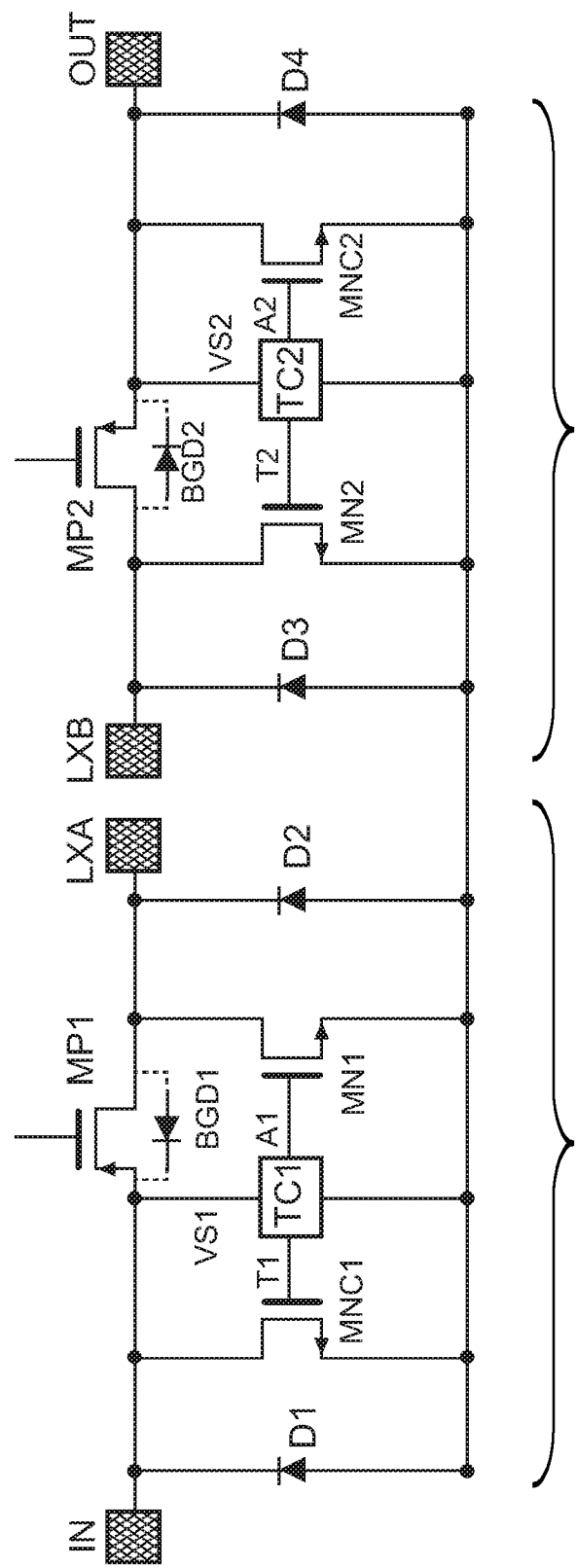
FIG. 2 shows a simplified schematic of a circuitry according to an embodiment of the present invention.

FIG. 2 shows a simplified schematic of a circuitry according to an embodiment of the present invention. The components shown in FIG. 2 are typically integrated on a semiconductor substrate in a CMOS process. The input pin designated by IN provides a connection to a voltage source which might be every kind of power supply, typically a battery. An inductor (an inductive coil or the like as indicated by L1 in FIG. 1) must be coupled between the pins designated by LXA and LXB for the typical application of the circuitry. The circuit of FIG. 2 includes two major parts, the down converting part DOWN_C and the up converting part UP_C. The up- or down-converted output voltage is provided on output pin OUT. The pins IN, OUT, LXA, LXB might be exposed to excess voltage or excess current during manufacturing, assembly or operation due to electrostatic discharge (ESD). Accordingly, an effective ESD protection is necessary to prevent excess voltage or excess current to propagate to the integrated electronic devices, in particular to the MOS transistors used as switches, and to destroy these transistors. MOS transistors MN1 and MP1 are used as integrated switches for the up converting part. The transistors MN2 and MP2 are the respective switches of the down converting part of the DC/DC converter. The transistors MN1, MN2, MP1, MP2 are coupled by their respective gates to digital control signals which are pulse width modulated (PWM) or pulse frequency modulated (PFM). The switching signals for MP1, MP2 are not shown. Typically, the control signals are generated by an on-chip digital circuitry being programmable by external commands. Additionally, the width of MN1 is determined by the ON resistance value required. The width of MP1 is determined based on the width of MN1. The channel width of MP1 is typically chosen 2.5 times or 3 times greater than the channel width of MN1. The design procedure is the same for MN2 and MP2. The ON resistance of the switching transistors is predetermined by the efficiency of the converter and is a design parameter. Further, the circuit shown in FIG. 2 includes four diodes D1, D2, D3, and D4. In addition to the components needed for DC/DC conversion, the embodiment shown in FIG. 2 includes two clamp transistors MNC1 and MNC2 and integrated circuitries TC1, TC2. The logic circuit TC1 provides signals T1 and A1 to control the clamp transistors MNC1, MNC2 and the switching transistors MN1 and MN2 as will be explained below. Further, the back-gate diodes BGD1 and BGD2 of switching PMOS transistors MP1 and MP2 are indicated in FIG. 2. The back-gate diodes BGD1 and BGD2 are parasitic diodes due to technological properties of the CMOS process. However, as will be explained below, these rather parasitic devices are also exploited in a useful way for an aspect of the present invention.

According to an aspect of the invention, the control circuits TC1, TC2 activate the NMOS transistors MN1, MN2, MNC1, MNC2 of the circuit shown in FIG. 2 to FIG. 5 in response to an ESD event occurring at any of the pins IN, OUT, LXA, LXB. The over-voltage at the respective pins is reduced rapidly via different electrical paths as will be explained with respect to FIG. 3 to FIG. 5. An important aspect of the invention is the connection of TC1 to IN and TC2 to OUT. Therefore, this connection is additionally denoted by VS1 and VS2, respectively. The voltage on pins LXA and LXB switches during normal operation. The logic circuitry in TC1 and TC2 needs a somehow stable supply voltage to operate correctly. The two pins IN and OUT have stable voltages during normal operation. A higher voltage level occurs at the connection of TC1, i.e. at VS1, during an ESD event on pin IN. During an ESD event on LXA, voltage is coupled to IN through back gate diode BGD1. The increased voltage level is sufficient to turn both transistors, MN1 and MNC1, on. Consequently, the channels of MN1 and MNC1 provide low resistance paths to the ESD currents. The circuits TC1 and TC2 consume minimal current during an ESD event, as they present very high impedance compared to the channels of MN1 and MNC1. The same considerations apply for the other half of the circuit shown in FIG. 2. The right hand side of FIG. 2, showing the up conversion part, includes respective transistors MN2 and MNC2 which operate in a similar manner as described above, for ESD events occurring on pins LXB and OUT.

Figure 3:
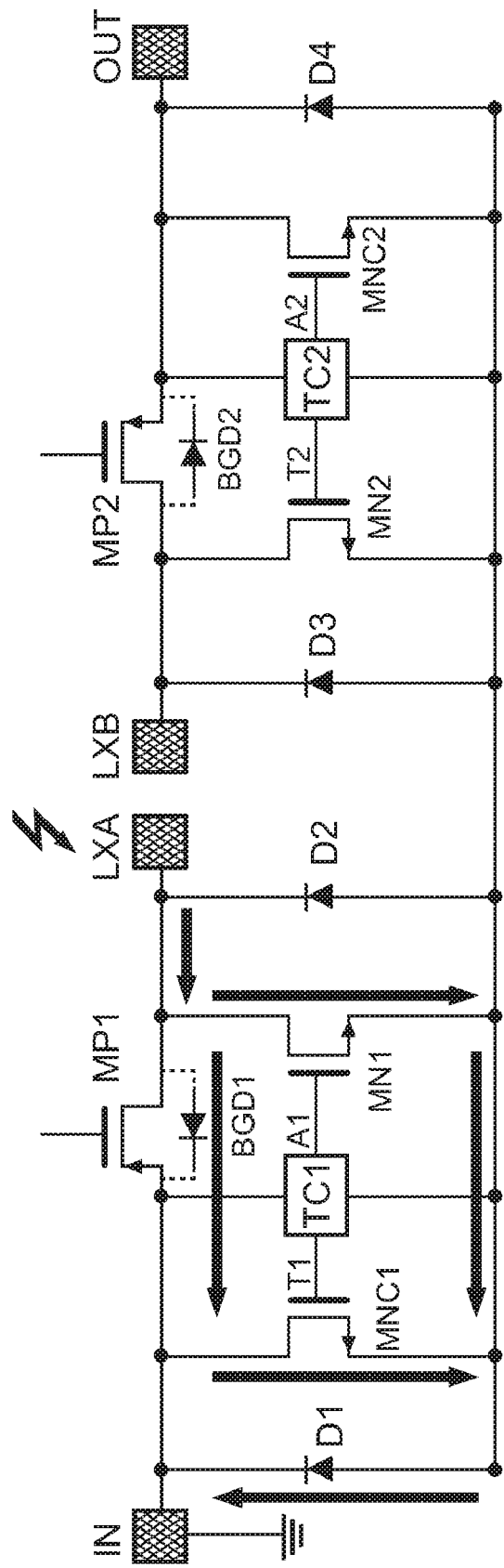
FIG. 3 shows a possible current distribution in response to a first ESD event for the circuitry of FIG. 2.
Figure 5:
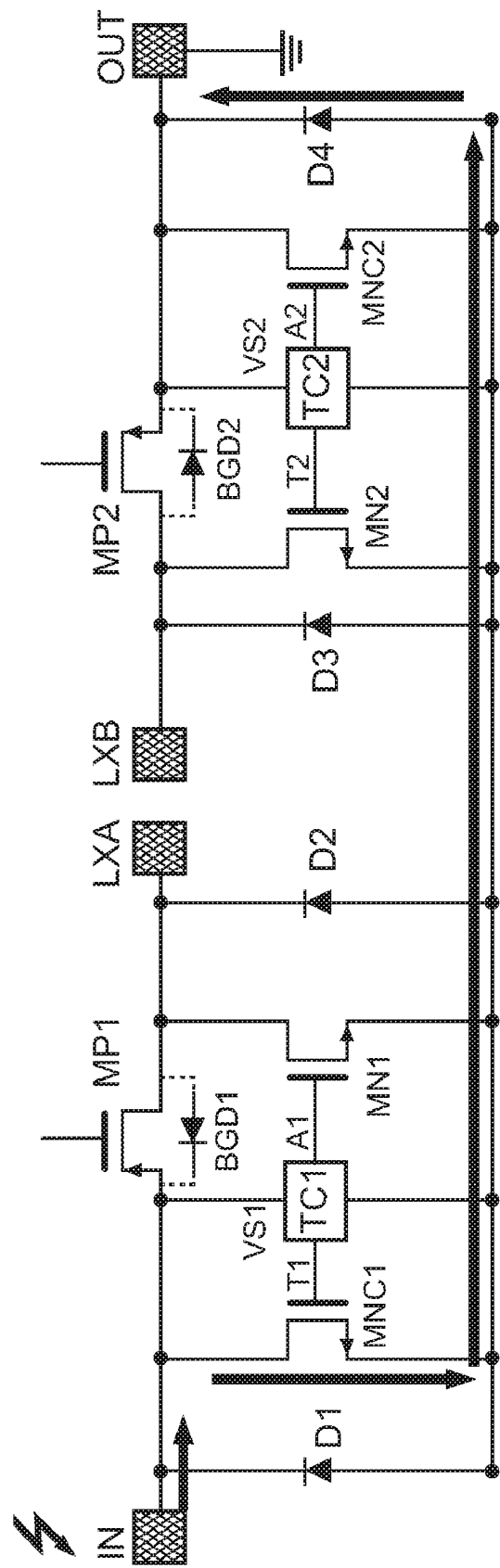
FIG. 5 shows a possible current distribution in response to a third ESD event for the circuitry of FIG. 2.

It is to be mentioned that the circuit shown in FIG. 2 is suitable to protect against any ESD events (e.g. during manufacture or assembly). During normal operation (i.e. not an ESD event), the power to the trigger circuit TC1 (FIG. 2) is provided by a battery or a voltage source on pin IN. The power to the trigger circuit TC2 (FIG. 2) is provided by the voltage on OUT pin. During an ESD event on pin IN, the ESD pulse experienced at pin IN is used to supply or at least to support the operation of TC1. Additionally, during an ESD event on LXA, the voltage supplied via BGD1 also supports the operation of TC1. It is to be noted that TC2 does not operate during the above two events. However, the above considerations are valid for LXB and OUT respectively as the right hand side circuit UP_C is considered a mirrored version of left half part DOWN_C of the circuit by replacing LXA by LXB and IN by OUT. FIG. 3. to FIG. 5 are mere illustrations useful to understand important aspects of the invention. There are at least 12 ESD combinations and hence 12 current path combinations that may occur in the circuit shown in FIG. 2. Not all current paths and combinations of current paths are shown, but they are apparent from the described examples for those skilled in the art. For example ESD events from LXB to OUT, from LXB to IN, and from OUT to IN are not separately shown, yet the invention is equally functional and beneficial for those ESD events. FIG. 3 shows a current distribution in response to a first ESD event for the circuitry of FIG. 2. Accordingly, FIG. 3 shows a situation where pin LXA experiences an ESD event with respect to the input pin IN. The voltage difference between LXA and IN is supposed to be at maximum. A flash at pin LXA indicates the ESD event. The input pin is supposed to be on a much lower voltage level, typically on ground level, as indicated by the ground symbol. In this situation the back-gate diode BGD1 of PMOS transistor MP1 is driven forward and provides an ESD current to the trigger circuit TC1. In response to the current through the back-gate diode BGD1, the trigger circuit TC1 activates clamp transistor MNC1 via signal T1. Further, TC1 also activates switching transistors MN1 via activating signal A1. One part of the ESD current flows through both transistors MN1 and MNC1 and further through the diode D1 towards the ground potential at input pin IN. Bold arrows indicate this current path. It is to be noted that a part of the ESD current also flows directly to grounded pin IN. But the majority of the current flows through MNC1 and D1 since MNC1 is turned on by TC1. For a given gate to source voltage (sufficient to turn on the transistor) and width of the transistor the transistor has to conduct a specific amount of current. As the PMOS transistor MP1 is larger (i.e. MP1 has a greater channel width) than the NMOS transistor MN1, the back gate diode BGD1 of MP1 can handle large amounts of current and also protect MP1 from destruction during an ESD event on pin LXA and respective grounding on either of the pins IN, LXB and OUT. A current at the drain of MN1 is distributed through BGD1 and MN1. Current through D1 is the current through MN1 and current from MNC1. A current through BGD1 will consequently be seen at the drain of MNC1. However, the current at the drain of MNC1 is again distributed, while a small part of it runs directly to ground; the other part goes through MNC1. Conventionally, only a single transistor MN1, which is suitable to handle all the ESD current was provided. The conventional switching transistor needed a large channel width as it was implemented by special layout techniques. According to the present invention, a further transistor MNC1 is included, which eases the requirements for MN1. Accordingly, the width of MN1 is reduced and special layout techniques are dispensable. The combined width of MN1 and MNC1, using conventional layout techniques, is still less than ESD protection according to the prior art using special layout techniques for NMOS devices as described above with respect to the known techniques. The same considerations are applicable, if the input pin LXB is stressed with respect to a grounded output pin OUT. In this situation, a current through back-gate diode BGD2 of MP2 activates the control circuit TC2. The clamp transistor MNC2 and the switching transistor MN2 are activated by signals T2 and A2 and provide the respective current paths to discharge LXB.

Figure 4:
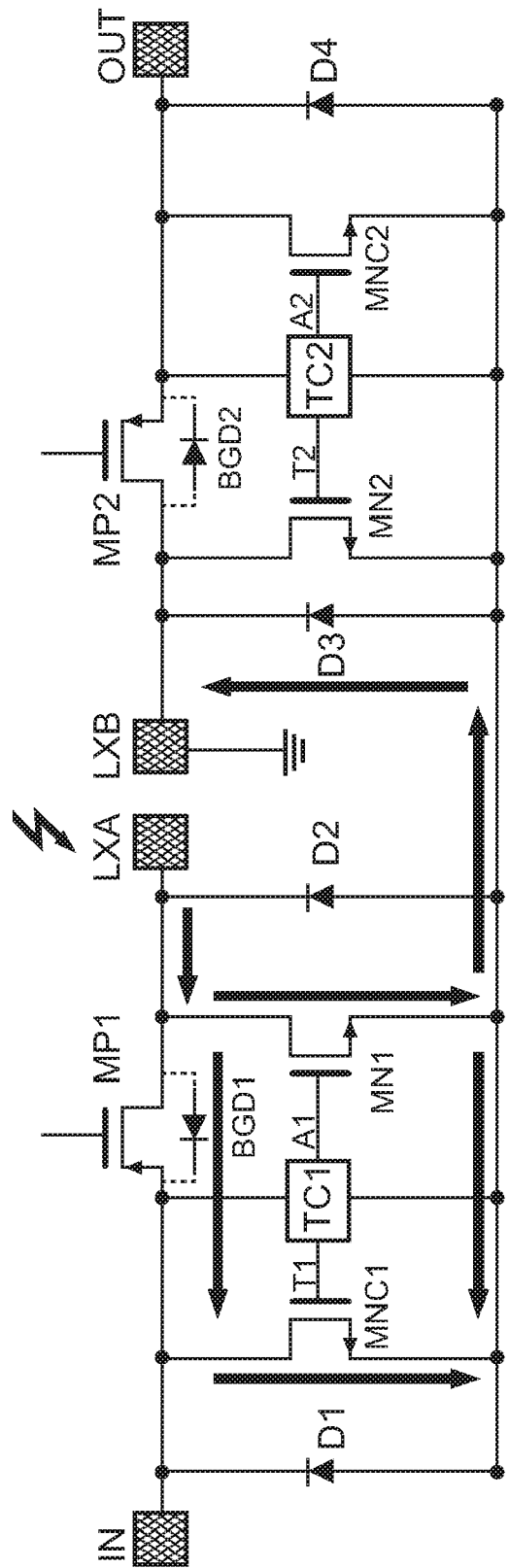
FIG. 4 shows a possible current distribution in response to a second ESD event for the circuitry of FIG. 2.

FIG. 4 shows a current distribution in response to a second ESD event for the circuitry of FIG. 2. According to the second ESD configuration, the pin LXB is supposed to be on ground potential and the excess voltage, indicated by the flash, occurs still at pin LXA. Accordingly, the over current propagates from pin LXA through the back-gate diode BGD1 to control circuit TC1 prompting thereby the control circuit TC1 to activate transistors MNC1 and MN1 by signals T1, A1. Consequently, the ESD current flows through two transistors MNC1 and MN1 to ground and finally through forward driven diode D3 to pin LXB.

FIG. 5 shows a current distribution in response to a third ESD event for the circuitry of FIG. 2. FIG. 5 shows a configuration of the worst-case situation of an ESD event. The worst-case situation occurs when the input pin IN is stressed and the output pin OUT is supposed to be at ground potential. This situation is equivalent to an ESD event where the output pin OUT experiences an ESD event with respect to the input pin IN at ground. This is the worst-case situation as the transistors MN1 and MN2 cannot contribute to ESD protection. In these cases, the PMOS devices MP1 and MP2 can be destroyed by an ESD event. The transistors MNC1 and MNC2 prevent the destruction of MP1 and MP2, respectively. Accordingly, the entire DC/DC converter—including the up conversion and the down conversion part—is efficiently protected against all combinations of ESD events. In fact, the lateral parasitic NPN combination of clamp transistor MNC1 is exposed to the ESD excess voltage. The dimensions of the clamp transistor MNC1 (and also for the reverse situation MNC2) have to be chosen accordingly. The dimensioning of transistor MNC1 under the above considerations will be explained with respect to FIGS. 7 and 8.

Figure 6:
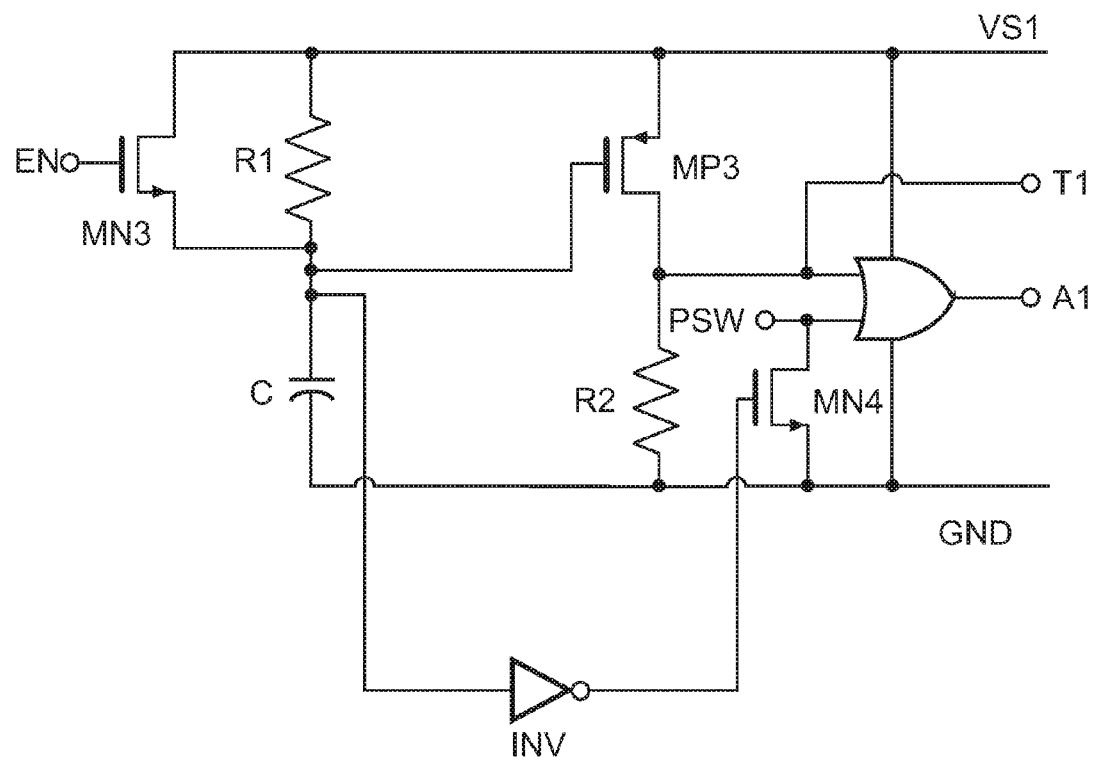
FIG. 6 shows a simplified schematic of a control circuit according to an embodiment of the invention.

FIG. 6 shows a simplified schematic of a control circuit according to an embodiment of the present invention. It is to be understood that the circuit shown in FIG. 6 is included in TC1 and TC2 as shown in FIG. 2 to FIG. 5. Accordingly, although the following explanations relate only to the left side DOWN_C of the circuit shown in FIG. 2 and to TC1, all pins and reference signs can be replaced by their counterparts of the right hand part UP_C of the circuit. The circuit is supplied by VS1, which is usually coupled to a stable supply voltage source via input pin IN. The pins EN and PSW are not shown in FIGS. 2 to 5 as they are coupled externally to the circuit TC1. Under normal operating conditions the enable signal EN, which is provided by additional control circuitry, is logic HIGH. Accordingly, the capacitor C is charged via NMOS transistor MN3. A high potential on the capacitor C turns PMOS transistor MP3 off. As the inverter INV produces a LOW output potential on the gate of MN4, MN4 is also turned off. If MP3 is turned off, the output signal T1 is tied to ground potential GND by resistor R2. T1 is also the input of OR gate. The other input signal of the OR gate is PSW, and, as MN4 is turned off and T1 is LOW, PSW—which is the switching signal for MN1 from external logic circuitry—alone determines the output signal A1 of the OR gate. T1 is to be coupled to the gate of clamp transistors MNC1. Accordingly, the clamp transistor MNC1 is switched off. The output signal A1 of OR1 is coupled to switching transistor MN1. Accordingly, under normal operating conditions, the output signal A1 is defined by PSW. PSW provides the switching signal for MN1 necessary to carry out the required DC/DC conversion operation. If an ESD event occurs, MN3 is switched off as there is no voltage (ground level) on EN and capacitor C is charged through R1. Initially, as there is no charge on capacitor C, the potential across C is zero. Consequently INV produces a HIGH output signal and MN4 is switched on. PSW is tied to ground via MN4 and the output signal A1 of the OR gate is defined by T1. However, T1 is now pulled to VS1 as MP3 is turned on. This results in a HIGH voltage level for T1 and A1. The clamp transistor MNC1 and the switching transistors MN1 are turned on in order to provide the required ESD protection as described with respect to FIG. 3 to FIG. 5. After some time which is determined by the time constant of R1 and C, C is charged to a voltage greater than the switching voltage of INV, such that INV switches from HIGH to LOW. MN4 is switched off. PSW is issued by the external circuitry and during an ESD event, PSW is turned off (i.e. is LOW) or experiences no event. T1 is still pulled to VS1 as MP3 is still on. This results in a HIGH voltage level for T1 and A1. The clamp transistor MNC1 and the switching transistor MN1 are both turned on in order to provide the required ESD protection as described with respect to FIGS. 3 to 5. After a certain time, which is also determined by the time constant implemented by R1 and C, capacitor C is charged completely to a voltage level, at which MP3 is turned off. T1 is now LOW and A1 is also LOW. MN1 and MNC1 are now turned off. However, at this time, all the ESD current is discharged via MN1 and MNC1 and the ESD event is overcome. It will be appreciated by those skilled in the art that the control circuits TC1 and TC2 can have identical properties and behavior. Accordingly, the above explanations are also applicable to TC2 except that VS1, T1, and A1 are to be replaced by their equivalents VS2, T2, and A2. Further, the circuits TC1 and TC2 as shown in FIG. 2 to FIG. 5 can be implemented as one single control circuit for all transistors, such that multiple transistors are activated by the same signals, i.e. T1 is equal to T2 and A1 is equal to A2 and at the same time. Further, as appreciated by those skilled in the art, although the operation of the ESD protection according to the present invention is explained by way of example with respect to the three FIGS. 3 to 5, the ESD protection concept and the respective embodiments cover all kinds of combinations of the shown examples. Accordingly, an excess voltage may occur on two or more pins simultaneously and two or more pins may be grounded. Further, as the integrated circuits used for DC/DC conversion usually provide more than one external pin as IN, OUT, LXA and LXB, it is to be understood that the present invention covers all cases where the described signals are split over plural pins.

Figure 7:
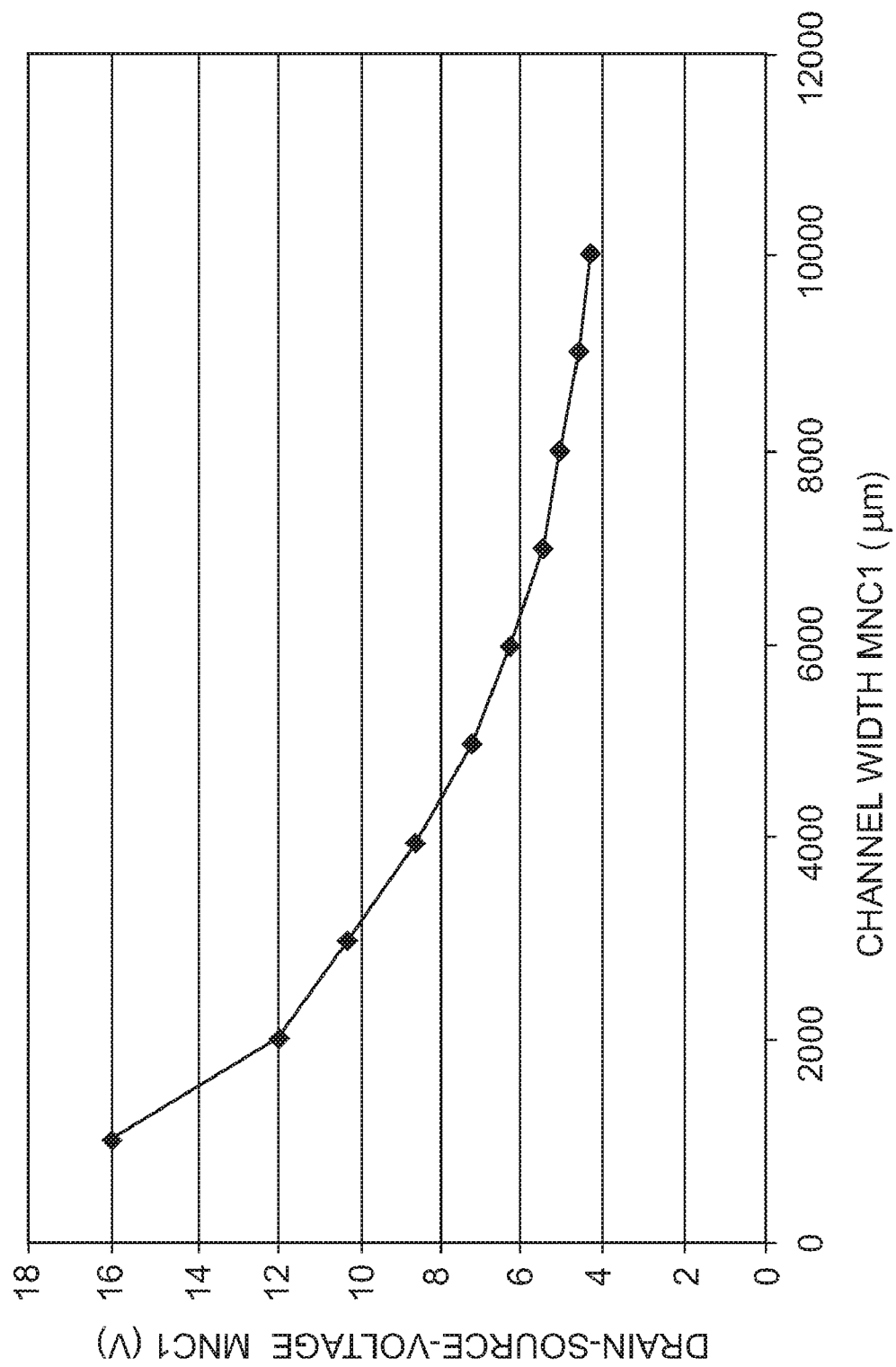
FIG. 7 shows a graph indicating the drain-source voltage of the clamp transistor versus the channel width of the clamp transistor for the third ESD event shown in FIG. 5.
Figure 9:
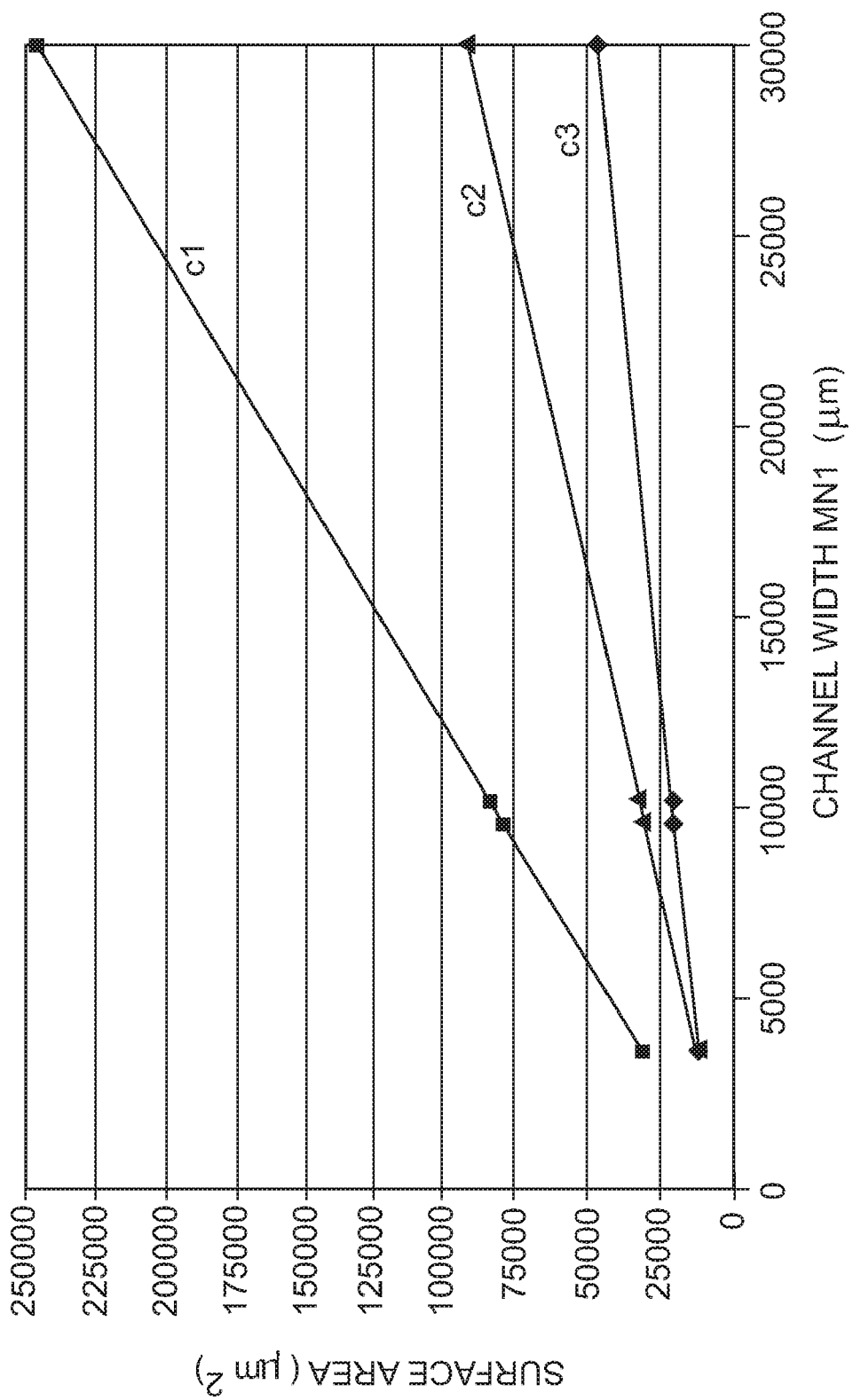
FIG. 9 shows a graph indicating the areas consumed by different ESD protection concepts compared to the solution provided by the present invention.

FIG. 7 shows a graph indicating the drain-source voltage of the clamp transistor MNC1 versus the channel width of the clamp transistor MNC1 for the third ESD event of FIG. 5. As could be derived from the shown graph, the clamp transistors MNC1 must have a minimum channel width to reduce the drain-source voltage below a specific value. The channel width relates directly to the required chip area for the devices. Although the channel of the clamp transistors must be chosen considerably wide, the overall area savings are still preserved. This advantage is indicated in FIG. 9. The values shown in FIG. 7 relate to an exemplary process. They may vary for other processes or technologies. The example shown in FIG. 7 applies equally to transistor MNC2 shown in FIGS. 2 to 5 and the corresponding ESD event.

Figure 8:
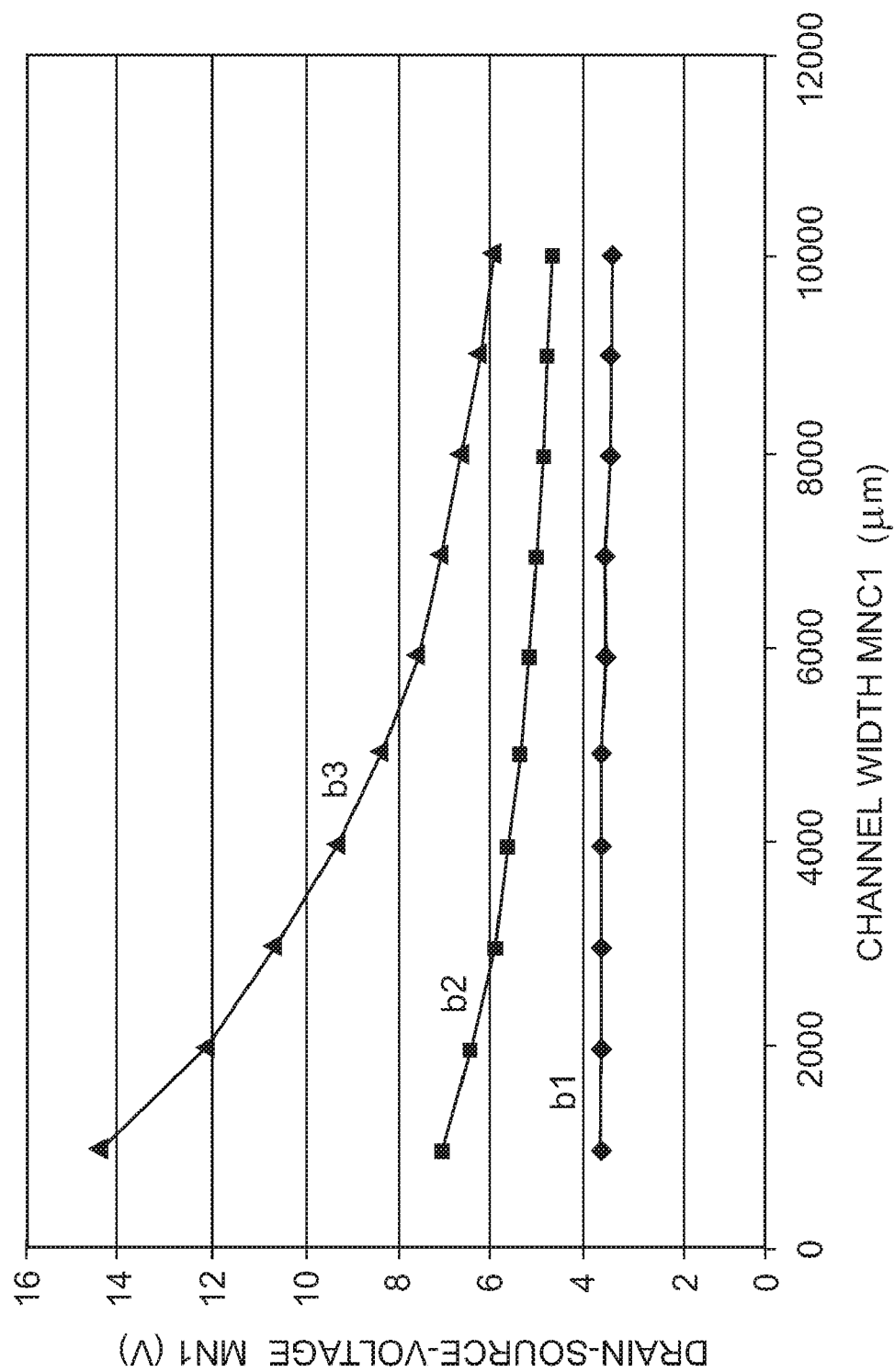
FIG. 8 shows the drain source voltage of the switching transistor versus the channel width of the clamp transistor for different values of the channel width of the switching transistor.

FIG. 8 shows the drain source voltage of the switching transistor MN1 versus the channel width of the clamp transistor MNC1 for different values of the channel width of the switching transistor for an exemplary manufacturing process. The shown example relates to the 200 V Machine Model. Curve b1 shows the relation for a channel width of MN1 of 500 μm. b2 relates to a channel width of MN1 of 5 mm and b3 to a channel width of MN1 of 20 mm. The same graph could be considered for MN2 and MNC2. The graphs of FIGS. 7 and 8 could be used to determine an appropriate channel width for clamp transistors MNC1, MNC2 and the switching transistors MN1 and MN2. In a first step, the required channel width of the clamp transistor MNC1 or MNC2 is determined by use of FIG. 7 under the constraint that a certain maximum drain-source voltage is admissible. For the clamp transistor MNC1 or MNC2 having the determined channel width, the channel width of the corresponding switching transistor MN1 or MN2 is determined based on the graph in FIG. 8.

FIG. 9 shows a graph indicating the surface areas consumed on a semiconductor substrate by different ESD protection concepts compared to the solution provided by the present invention for an exemplary technology. The curve c1 is the surface area to be consumed for the ESD protection according to the present invention for a specific process. Curve c2 relates to a concept where ballasting resistors used as ESD protection means. Curve c3 is an estimation for the silicide principle as explained in the introductory portion of this description. It will be appreciated that the present invention provides reduced area consumption and therefore reduced costs with respect to these prior art solutions. According to this aspect of the present invention, the combined width of MN1 and MNC1 shown in FIGS. 2 to 5 is still less than a single NMOS implemented according to the special layout techniques which are used by the prior art.

While the invention has been illustrated and described in detail in the drawings and foregoing description, such illustrations and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A plurality of pins, transistors or other units may fulfill the functions of one item recited in the claims, and vice versa. The mere fact that certain measures are recited in mutually different dependent claims does not indicate that a combination of these measures cannot be used to advantage. Any reference signs in the claims should not be construed as limiting the scope.

The invention claimed is:

1. An electronic device, including electronic circuitry, the circuitry comprising:
   a first switching transistor being adapted to serve as an integrated switch for either DC/DC up conversion or for DC/DC down conversion, and
   a first clamp transistor being coupled to the first switching transistor and being adapted to protect the first switching transistor, if an ESD event occurs.

2. An electronic device according to claim 1, further comprising a second switching transistor being adapted to serve as an integrated switch, and a second clamp transistor being coupled to the second switching transistor, the second clamp transistor being adapted to protect the second switching transistor, if an ESD event occurs.

3. An electronic device according to claim 2, further comprising a third switching transistor and fourth switching transistor, the third switching transistor and the first switching transistor being coupled to operate as switches for DC/DC down conversion and to receive an input voltage on an input pin (IN), the fourth switching transistor and the second switching transistor being coupled to operate as switches for DC/DC up conversion and to provide an output voltage on an output pin (OUT), wherein the first clamp transistors and the second clamp transistor are adapted to protect the first, second, third, and fourth transistors, if an ESD event between the input pin (IN) and the output pin (OUT) occurs.

4. An electronic device according to claim 3 further comprising control circuitry for providing an activating signal, wherein the control circuitry is adapted to be at least partially supplied by the voltage or current of the ESD event.

5. An electronic device according to claim 2 further comprising a control circuitry for providing an activating signal, wherein the control circuitry is adapted to be at least partially supplied by the voltage or current of the ESD event.

6. An electronic device according to claim 1, wherein both, the first switching transistor and the first clamp transistor are adapted to be activated for protecting the first switching transistor, if an ESD event occurs.

7. An electronic device according to claim 1, wherein the first clamp transistor is coupled to an activating signal to be activated during an ESD event, the activating signal being derived from a parasitic current or voltage.

8. An electronic device according to claim 7, wherein the parasitic voltage or current is provided by a parasitic diode of the third switching transistor.

9. An electronic device according to claim 1, further comprising a control circuitry for providing an activating signal, wherein the control circuitry is adapted to be at least partially supplied by the voltage or current of the ESD event.

10. An electronic device according to claim 9, further comprising said control circuitry for providing the activating signal, wherein the control circuitry is adapted to either provide a switching signal (PSW) to the first switching transistor during normal operation or to provide the activating signal to the first switching transistor and the second transistor if the ESD event occurs.

* * * * *